(12) United States Patent
Zheng

(10) Patent No.: US 11,635,912 B2
(45) Date of Patent: *Apr. 25, 2023

(54) DISTRIBUTED MIDPLANE FOR COMPUTER SYSTEM

(71) Applicant: JABIL INC., St. Petersburg, FL (US)

(72) Inventor: Fengquan Zheng, San Jose, CA (US)

(73) Assignee: JABIL INC., St. Petersburg, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/650,714

(22) Filed: Feb. 11, 2022

(65) Prior Publication Data

US 2022/0164129 A1    May 26, 2022

Related U.S. Application Data

(63) Continuation of application No. 17/094,936, filed on Nov. 11, 2020, now Pat. No. 11,281,398.

(51) Int. Cl.
*G06F 3/06* (2006.01)
*G06F 13/42* (2006.01)

(52) U.S. Cl.
CPC .......... *G06F 3/0655* (2013.01); *G06F 3/0613* (2013.01); *G06F 3/0688* (2013.01); *G06F 3/0689* (2013.01); *G06F 13/4221* (2013.01); *G06F 13/4282* (2013.01); *G06F 2213/0026* (2013.01); *G06F 2213/0028* (2013.01)

(58) Field of Classification Search
CPC .. G06F 1/183; G06F 13/4221; G06F 13/4282; G06F 2213/0026; G06F 2213/0028; G06F 3/0613; G06F 3/0655; G06F 3/0688; G06F 3/0689

USPC ........................................................ 711/154
See application file for complete search history.

(56) References Cited

U.S. PATENT DOCUMENTS

| 10,331,617 | B2 | 6/2019 | Zheng | |
|---|---|---|---|---|
| 2015/0092788 | A1* | 4/2015 | Kennedy | H05K 7/1438 361/679.4 |
| 2015/0309951 | A1* | 10/2015 | Breakstone | G06F 13/4022 710/313 |
| 2021/0240235 | A1* | 8/2021 | Christensen | G11B 33/124 |

OTHER PUBLICATIONS

U.S. Appl. No. 16/827,831, filed Mar. 24, 2020. Inventors Fengquan Zheng and Ronald E. St. Germain; Applicant: Jabil Inc.; Title: Orthogonal Structure With Riser Card.

* cited by examiner

*Primary Examiner* — Hashem Farrokh
(74) *Attorney, Agent, or Firm* — Shumaker, Loop & Kendrick, LLP; John A. Miller

(57) ABSTRACT

A computer system including a frame, components and a pair of stacked controllers. The system also includes a plurality of midplanes positioned between the components and the controllers where each midplane includes a component edge and a controller edge, a first midplane connector coupled to the component edge and a second midplane connector coupled to the controller edge, where the first midplane connector is coupled to one of the component connectors and the second midplane connector is coupled to one of the controller connectors so that the midplanes are vertically oriented in parallel so as to define spaces therebetween. In one embodiment, the computer system is a data storage system, the components are storage drives and the controllers are storage controllers.

16 Claims, 6 Drawing Sheets

DISTRIBUTED MIDPLANE FOR COMPUTER SYSTEM

CROSS-REFERENCE TO RELATED APPLICATIONS

This application is a Continuation application of application Ser. No. 17/094,936, titled, Distributed Midplane For Data Storage System Enclosures, filed Nov. 11, 2020.

BACKGROUND

Field

This disclosure relates generally to a computer system and, more particularly, to a computer system that includes a plurality of spaced apart midplanes that each provide an electrical connection between a component and a pair of controllers, where the midplanes are distributed to allow increased airflow through the system.

Discussion of the Related Art

A typical 2U data storage system includes 24 storage drives, such as hard drives or flash drives, positioned at a front of the system enclosure and two stacked storage controllers and power supply units (PSUs) positioned at the rear of the enclosure. Likewise, a typical 4U data storage system includes 48 storage drives stacked in two rows of 24 storage drives positioned at a front of the system enclosure and two stacked storage controllers and PSUs positioned at the rear of the enclosure. A printed circuit board assembly (PCBA) midplane is positioned between the storage drives and the storage controllers and provides an interconnection interface between the drives and the controllers for transmitting signals therebetween, where the midplane includes front side connectors that interface with the drives and rear side connectors that interface with the storage controllers. This configuration allows both of the controllers to access the data stored on all of the drives and provide the data through input/output cards to certain servers and computing systems, where the controllers provide system redundancy. Known midplanes can be very complex often including twelve or more layers providing numerous signal paths for connecting the drives to the storage controllers.

As the industry moves from PCIe Gen 4 (16GT/s) to PCIe Gen 5 (32GT/s) protocols and higher, signal loss becomes worse and un-acceptable due to long PCB trace on a known midplane, ultra-low loss PCB materials. A specific higher speed connector may be used to compensate for partial signal loss and an extra re-timer may be added in order to meet signal quality requirements, but these solutions will significantly increase product cost. In addition, the new generation drives and processors inside the storage controller will consume more and more power, and thus, there will be a challenge for providing adequate venting for cooling of the storage controllers when employing known midplanes because these midplanes block airflow and reduce thermal performance.

SUMMARY

The following discussion discloses and describes a computer system including a frame, a plurality of components positioned along a row at a front of the frame where each component includes a component connector, and a pair of stacked controllers positioned at a rear of the frame where each controller includes a controller connector for each component. The system also includes a plurality of midplanes positioned between the components and the controllers where each midplane includes a component edge and a controller edge, a first midplane connector coupled to the component edge and a second midplane connector coupled to the controller edge, and where the first midplane connector is coupled to one of the component connectors and the second midplane connector is coupled to one of the controller connectors so that the midplanes are vertically oriented in parallel so as to define spaces therebetween. In one embodiment, the computer system is a data storage system, the components are storage drives and the controllers are storage controllers.

Additional features of the disclosure will become apparent from the following description and appended claims, taken in conjunction with the accompanying drawings.

DETAILED DESCRIPTION OF THE EMBODIMENTS

The following discussion of the embodiments of the disclosure directed to a computer system including a plurality of distributed midplanes each connecting one or two components to two controllers is merely exemplary in nature, and is in no way intended to limit the disclosure or its applications or uses.

Figure 1:
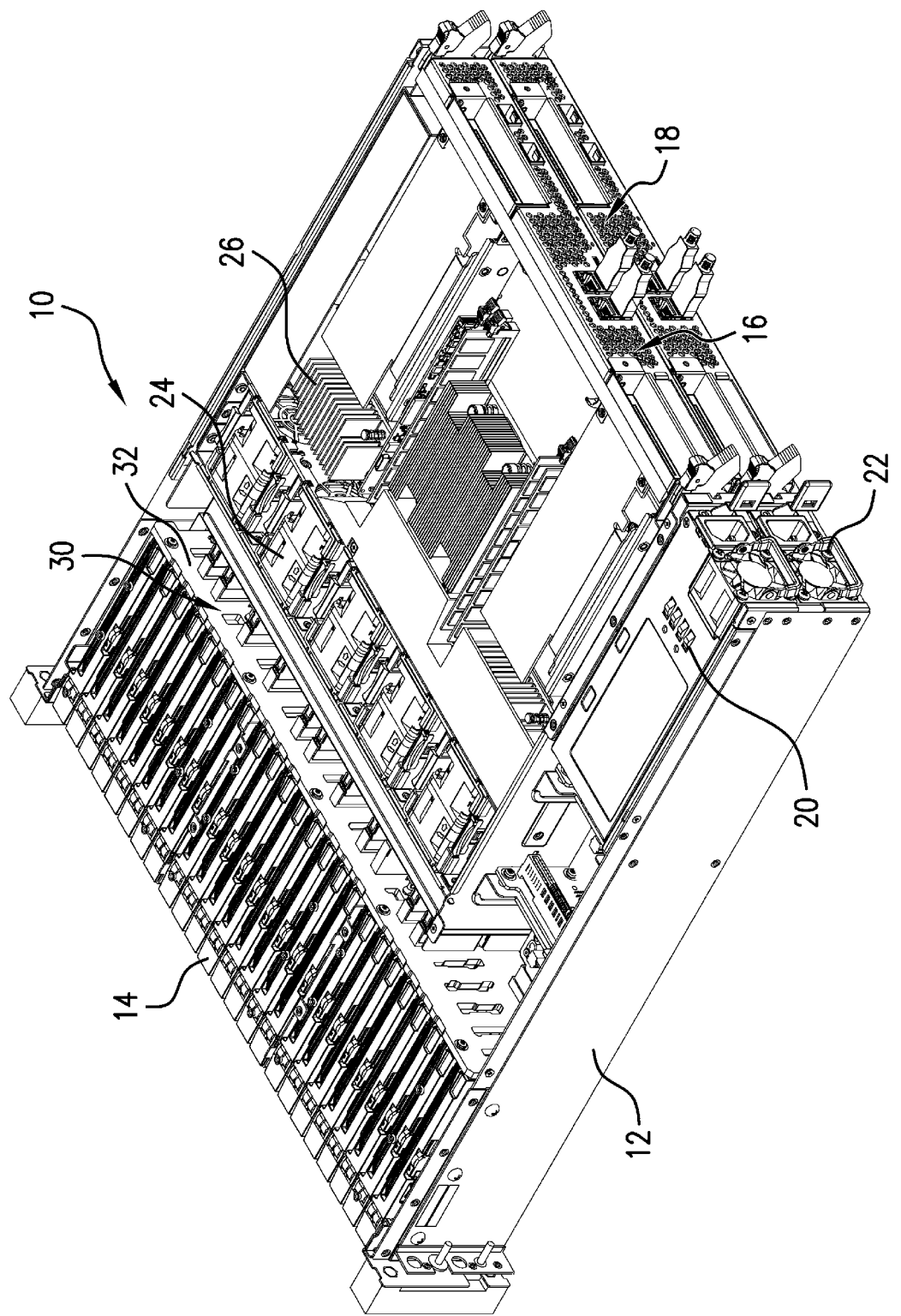
FIG. 1 is a rear isometric view of a known 2U data storage system including a midplane that provides an electrical connection between storage drives and storage controllers.

FIG. 1 is an isometric view of a known 2U data storage system 10 including a frame 12, where an outer chassis of the system 10 has been removed to expose the components therein. The storage system 10 is intended to represent any suitable data storage system consistent with the discussion herein and operates using any suitable protocol, such as peripheral component interconnect (PCI) express (PCIe), serial attached SCSI (SAS), open coherent accelerator processor interface (OpenCAPI), Gen-Z, cache coherent interconnect for accelerators (CCIX), and compute express link (CXL). The system 10 includes a plurality of aligned storage drives 14, for example, a row of twenty-four U2 drives, provided at a front of the system 10. The system 10 also includes a pair of stacked storage controllers 16 and 18 positioned at a rear of the system 10 and being operable to store and extract data among and between the drives 14, as is well known by those skilled in the art. The system 10 further includes a pair of PSUs 20 and 22 positioned adjacent to the controllers 16 and 18 providing power for the system 10 and a number of fans 24 and heat sinks 26 for cooling purposes.

Figure 2:
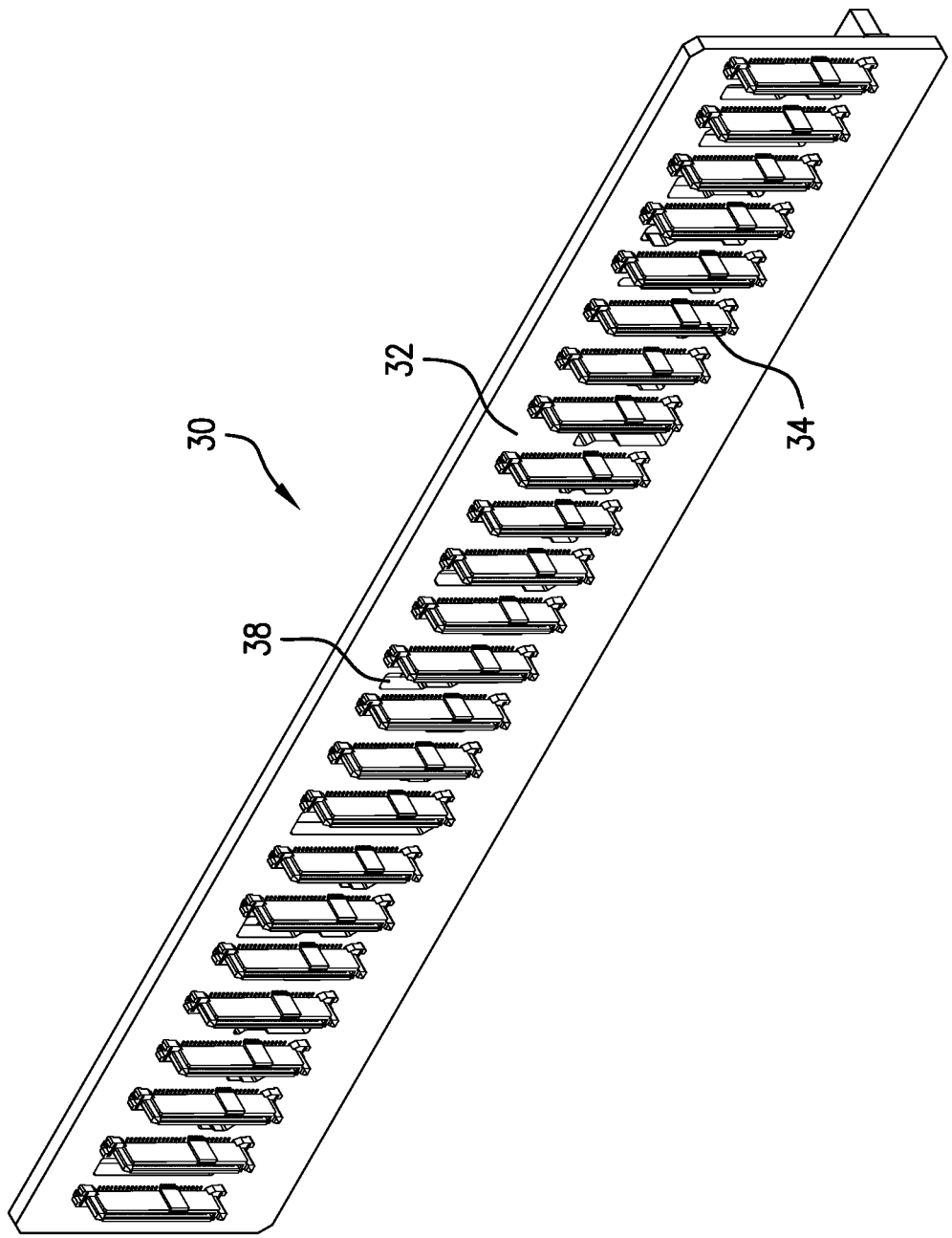
FIG. 2 is a front isometric view of the midplane removed from the system shown in FIG. 1.
Figure 3:
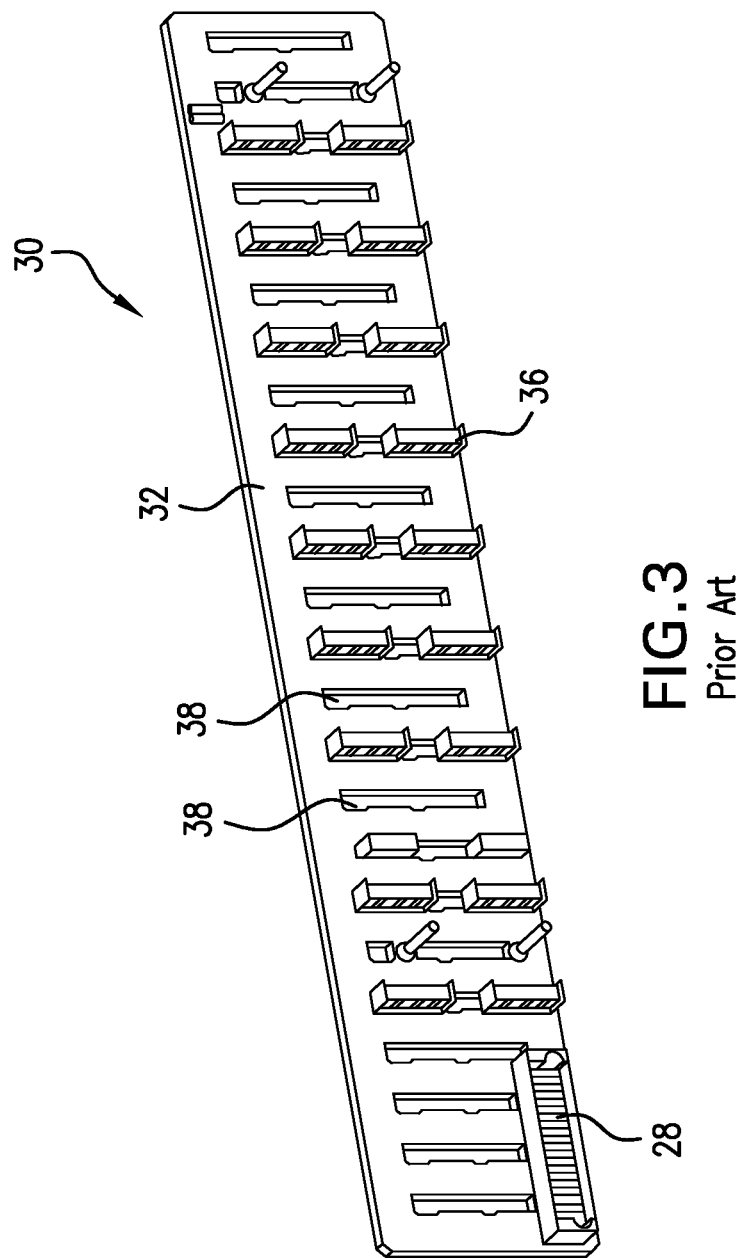
FIG. 3 is a rear isometric view of the midplane removed from the system shown in FIG. 1.

The system 10 also includes a midplane 30 positioned between the drives 14 and the controllers 16 and 18 and providing electrical connections therebetween in a known manner, where the midplane 30 includes a PCBA 32 having electrical traces to send signals among and between the drives 14 and the storage controllers 16 and 18. FIG. 2 is a front isometric view of the midplane 30 separated from the system 10 and showing a number of drive connectors 34 for connecting the drives 14 to the midplane 30. FIG. 3 is a rear isometric view of the midplane 30 separated from the system 10 and showing a number of controller connectors 36 for connecting the storage controllers 16 and 18 to the midplane 30. A special configuration of slots 38 and other openings extend through the PCBA 32 to allow airflow through the midplane 30 for cooling purposes. A PSU connector 28 provides connection to the PSUs 20 and 22.

The electrical traces on the PCBA 32 provide signal paths between the connectors 34 and 36. It is often necessary to route the traces around the slots 38, which increases their length. Thus, as discussed above, the electrical traces in the midplane 30 and the know configuration of the slots 38 are often not conducive for the higher signal speeds and cooling requirements that are being developed in the art. For example, if greater cooling is required, the slots 38 may need to be larger, which likely will increase the length of the traces. Further, some of the slots 38 often need to be larger than other of the slots 38 for cooling purposes. Because of this, some of the controller connectors 36 are electrically coupled to several of the drive connectors 34, which also requires increased trace length.

As will be discussed in detail below, this disclosure proposes replacing the single piece midplane 30 with a plurality of spaced apart distributed midplanes that allow for shorter signal traces between the connectors that connect to the drives 14 and the connectors that connect to the storage controllers 16 and 18 and allow for the flow of air between the midplanes and establish redundant communications paths between them. The traces on the distributed midplanes can be very short to improve signal quality. In addition, the distributed midplanes reduce the total product cost compared to a traditional single piece midplane because they use a standard card edge connector that is low cost instead of a pair of ultra-high-speed backplane connectors between the midplane and the storage controller, have less PCB manufacturing cost due to less complexity of the small midplane, have lower cost PCB raw material and less layer counts and eliminates the need for re-timers.

Figure 4:
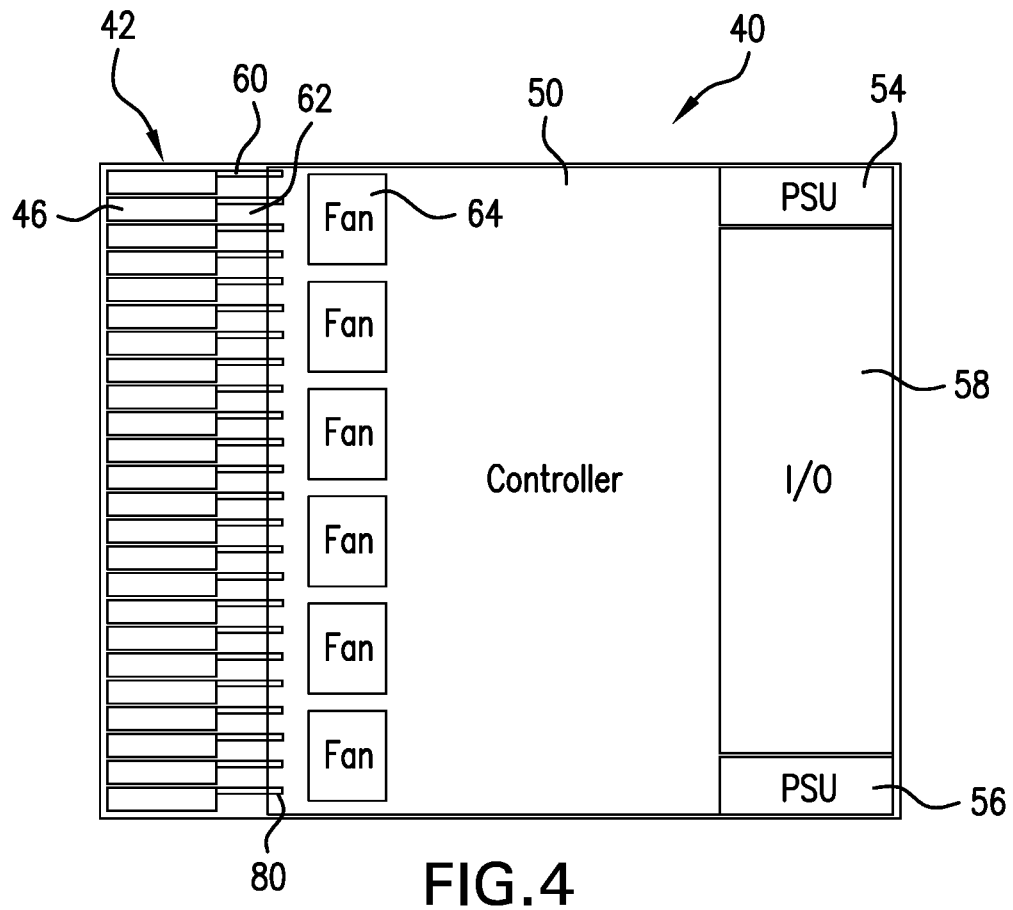
FIG. 4 is a top view of a simplified illustration of a 4U data storage system including a plurality of distributed midplanes each connecting two storage drives to two system controllers.
Figure 5:
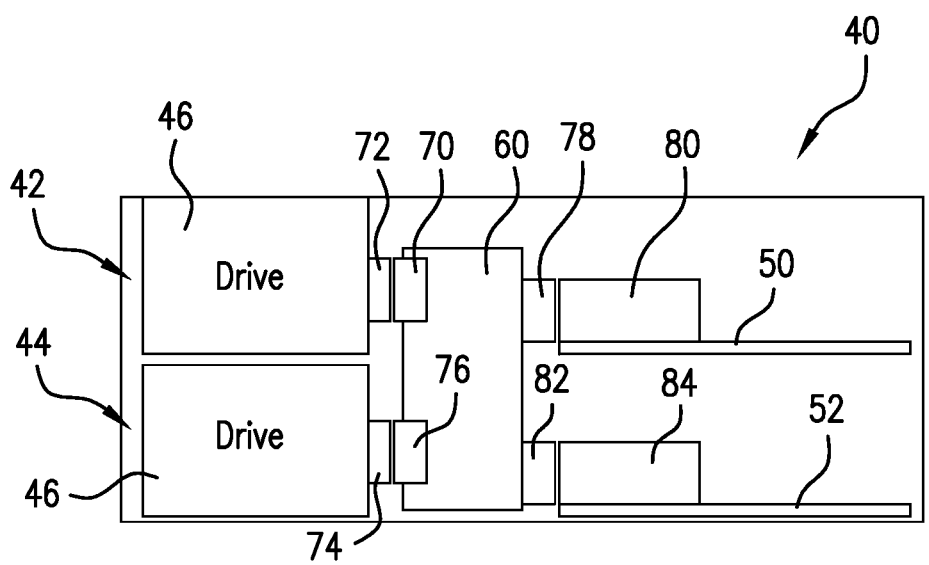
FIG. 5 is a side view of the data storage system shown in FIG. 4 showing one of the midplanes being connected to two drives and the two controllers.

FIG. 4 is a top view and FIG. 5 is a side view of a simplified illustration of a data storage system 40 of the type shown in FIG. 1.

The system 40 includes two stacked rows 42 and 44 of twenty-four storage drives 46, for example, E3 drives in a 4U data storage system or E1 drives in a 2U data storage system, each provided at a front of the system 10. The system 40 also includes a pair of stacked storage controllers 50 and 52 positioned at a rear of the system 40 and being operable to control data flow among and between the drives 46. The system 40 further includes a pair of PSUs 54 and 56 positioned adjacent to the controllers 50 and 52 and providing power for the system 40, where an input/output (I/O) area 58 is provided between the PSUs 54 and 56. The system 40 also includes twenty-four midplanes 60 distributed and spaced apart to provide spaces 62 therebetween. The system 40 further includes a number of fans 64 that provide airflow between the midplanes 60.

Figure 6:
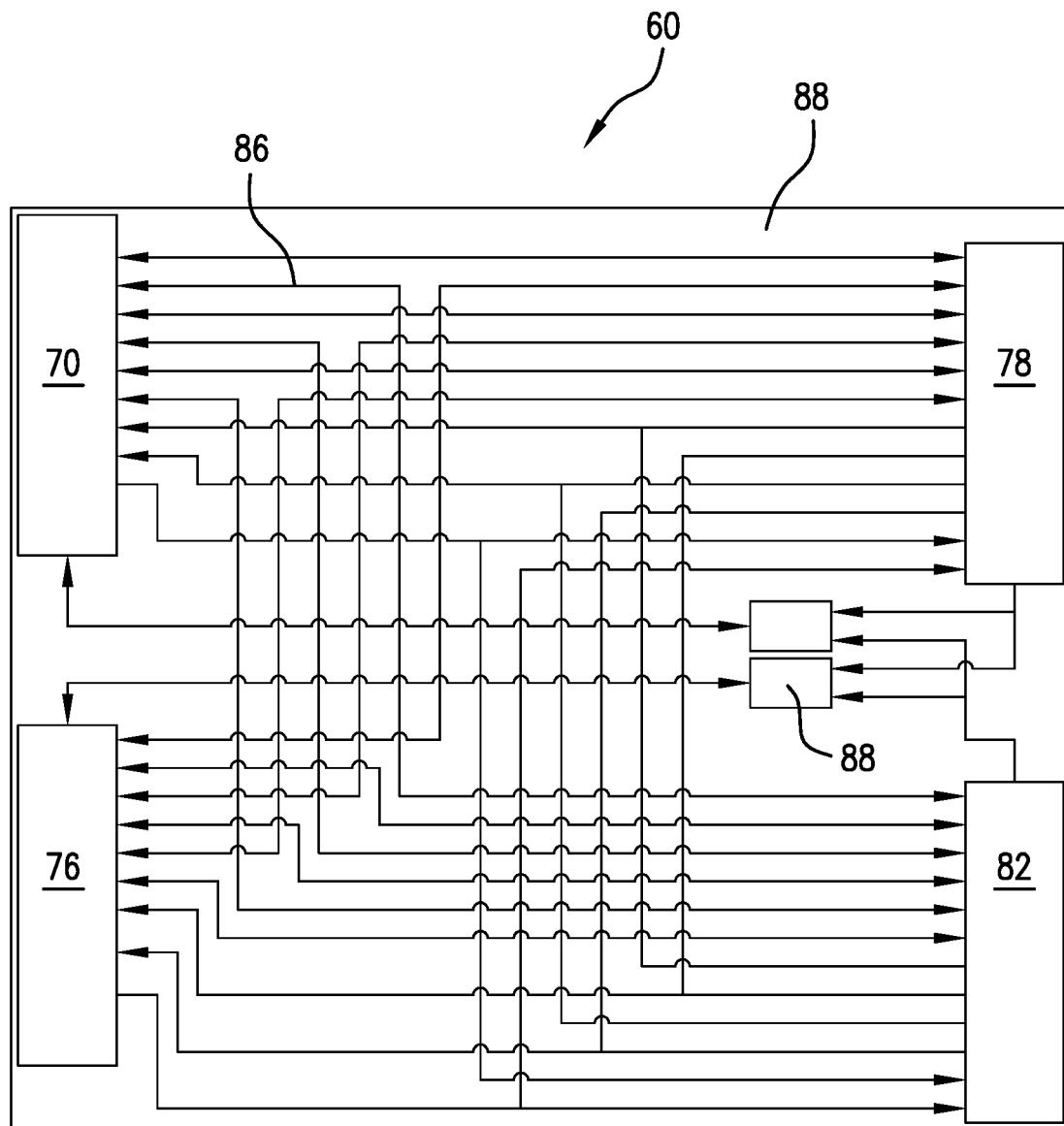
FIG. 6 is a side view of one of the midplanes separated from the data storage system shown in FIG. 4 and illustrating signal trace lines between the drive connectors and the controller connectors.

Each midplane 60 includes a connector 70 that is coupled to a connector 72 in one of the drives 46 in the top row 42 and a connector 76 that is coupled to a connector 74 in one of the drives 46 in the bottom row 44. Each midplane 60 also includes a connector 78 that is coupled to a connector 80 in the top storage controller 50 and a connector 82 that is coupled to a connector 84 in the bottom storage controller 52. FIG. 6 is a side view of one of the midplanes 60 separated from the system 40 and showing a number of signal traces 86 formed in a PCB 88 between the connectors 70, 76, 78 and 82. Diodes 88 control the flow of power from the controllers 50 and 52 to the drives 46. In one non-limiting embodiment, the connectors 72, 74, 78 and 82 are PCB golden fingers.

Figure 7:
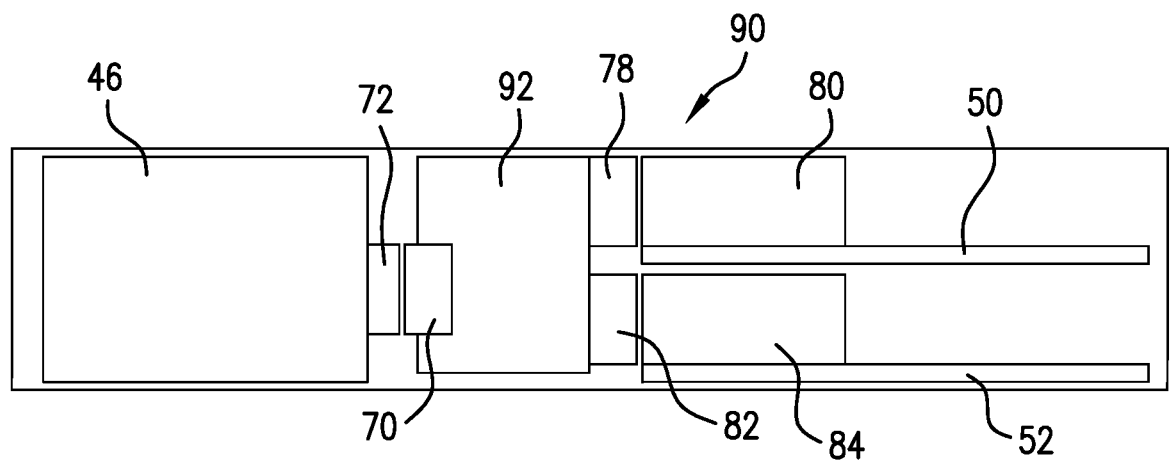
FIG. 7 is a side view of a data storage system showing a midplane being connected to one storage drive and two controllers.
Figure 8:
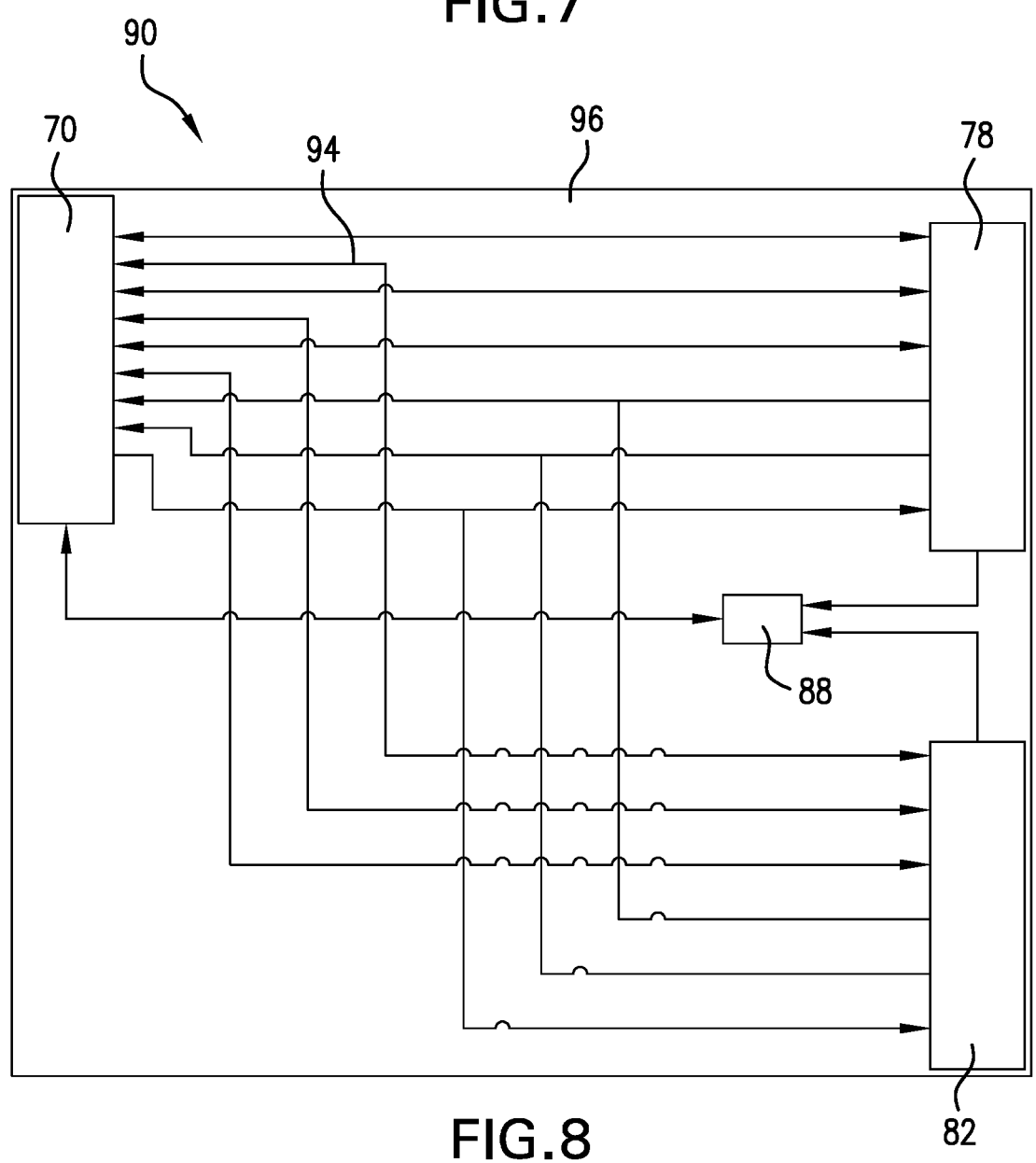
FIG. 8 is a side view of the midplane separated from the data storage system shown in FIG. 7 and illustrating signal trace lines between the drive connectors and the controller connectors.

FIG. 7 is a side view of a 2U data storage system 90 similar to the system 40, where there is only a single row of the drives 46 and where like elements are defined by the same reference number. The system 90 includes modified distributed midplanes 92 where the connector 76 has been removed. FIG. 8 is a side view of one of the midplanes 92 separated from the system 90 and showing a number of signal traces 94 formed in a PCB 96 between the connectors 70, 78 and 82.

The foregoing discussion discloses and describes merely exemplary embodiments of the present disclosure. One skilled in the art will readily recognize from such discussion and from the accompanying drawings and claims that various changes, modifications and variations can be made therein without departing from the spirit and scope of the disclosure as defined in the following claims.

What is claimed is:

1. A system comprising:
   a frame;
   a plurality of components positioned along a row at one end of the frame where each component includes a component connector;
   at least one controller positioned at an opposite end of the frame where the at least one controller includes a controller connector for each component; and
   a plurality of midplanes positioned between the components and the at least one controller where each midplane includes a component edge and a controller edge, each midplane further including a first midplane connector coupled to the component edge and a second midplane connector coupled to the controller edge, wherein the first midplane connector is coupled to one of the component connectors and the second midplane connector is coupled to one of the controller connectors so that the midplanes are vertically oriented in parallel so as to define spaces therebetween.

2. The system according to claim 1 wherein the at least one controller is a pair of controllers and wherein each midplane includes a third midplane connector coupled to the controller edge and another one of the controller connectors.

3. The system according to claim 1 wherein each midplane further includes a third midplane connector coupled to the component edge and being connected to one of the component connectors.

4. The system according to claim 1 wherein the system is a 2U data control system, the at least one controller is a pair of stacked controllers, the plurality of components is 24 components and the plurality of midplanes is 24 midplanes.

5. The system according to claim 1 wherein the system is a 2U data control system, the at least one controller is a pair of stacked controllers, the plurality of components is 48 components provided in two stacked rows of 24 components and the plurality of midplanes is 24 midplanes.

6. The system according to claim 1 wherein the system is a 4U data control system, the at least one controller is a pair of stacked controllers, the plurality of components is 48 components provided in two stacked rows of 24 components and the plurality of midplanes is 24 midplanes.

7. The system according to claim 1 wherein the at least one controller operates using PCI express (PCIe), serial attached SCSI (SAS), open coherent accelerator processor interface (OpenCAPI), Gen-Z, cache coherent interconnect for accelerators (CCIX) or compute express link (CXL) protocol.

8. The system according to claim 1 wherein the system is a data storage system, the components are storage drives and the controllers are storage controllers.

9. A system comprising:
a frame;
twenty-four components positioned along a row at a front of the frame where each component includes a component connector;
a pair of stacked controllers positioned at a rear of the frame where each controller includes a controller connector for each component; and
twenty-four midplanes positioned between the components and the controllers where each midplane includes a printed circuit board (PCB) having opposing side surfaces, a front edge, a rear edge and a plurality of electrical traces, each midplane further including a first midplane connector coupled to the front edge, a second midplane connector coupled to the rear edge and a third midplane connector coupled to the rear edge, wherein the first midplane connector is coupled to one of the component connectors and some of the electrical traces, the second midplane connector is coupled to one of the controller connectors and some of the electrical traces and the third midplane connector is coupled to another one of the controller connectors and some of the electrical traces so that the midplanes are vertically oriented in parallel so as to define spaces therebetween relative to a front to rear direction of the frame.

10. The system according to claim 9 wherein the controllers operate using PCI express (PCIe), serial attached SCSI (SAS), open coherent accelerator processor interface (OpenCAPI), Gen-Z, cache coherent interconnect for accelerators (CCIX) or compute express link (CXL) protocol.

11. The system according to claim 9 wherein the system is a data storage system, the components are storage drives and the controllers are storage controller.

12. A system comprising:
a frame;
forty-eight components positioned as two stacked rows of twenty-four components at a front of the frame where each component includes a component connector;
a pair of stacked controllers positioned at a rear of the frame where each controller includes a controller connector for each drive; and
twenty-four midplanes positioned between the components and the controllers where each midplane includes a printed circuit board (PCB) having opposing side surfaces, a front edge, a rear edge and a plurality of electrical traces, each midplane further including a first midplane connector coupled to the front edge, a second midplane connector coupled to the front edge, a third midplane connector coupled to the rear edge and a fourth midplane connector coupled to the rear edge, wherein the first midplane connector is coupled to one of the drive connectors of a drive in one row and some of the electrical traces, the second midplane connector is coupled to one of the component connectors in the other row and some of the electrical traces, the third midplane connector is coupled to one of the controller connectors and some of the electrical traces and the fourth midplane connector is coupled to another one of the controller connectors and some of the electrical traces so that the midplanes are vertically oriented in parallel so as to define spaces therebetween relative to a front to rear direction of the frame.

13. The system according to claim 12 wherein the system is a 2U system.

14. The system according to claim 12 wherein the system is a 4U system.

15. The system according to claim 12 wherein the controllers operate using PCI express (PCIe), serial attached SCSI (SAS), open coherent accelerator processor interface (OpenCAPI), Gen-Z, cache coherent interconnect for accelerators (CCIX) or compute express link (CXL) protocol.

16. The system according to claim 12 wherein the system is a data storage system, the components are storage drives and the controllers are storage controllers.

\* \* \* \* \*